United States Patent [19]

Dawson et al.

[11] Patent Number: 5,736,737

[45] Date of Patent: Apr. 7, 1998

[54] CONCATENATED MAGNETO-OPTIC FIELD SENSORS

[76] Inventors: Jay W. Dawson; Trevor W. MacDougall, both of P.O. Box 33427, St. Paul, Minn. 55133-3427

[21] Appl. No.: 561,810

[22] Filed: Nov. 22, 1995

[51] Int. Cl.[6] .................. H01J 5/16; G01J 4/00
[52] U.S. Cl. .................. 250/227.17; 250/227.14; 324/96
[58] Field of Search .............. 250/227.14, 227.17; 324/96, 97; 385/12

[56] References Cited

U.S. PATENT DOCUMENTS

| | | | |
|---|---|---|---|
| 3,605,013 | 9/1971 | Yoshikawa | 385/12 |
| 4,255,018 | 3/1981 | Ulrich et al. | 385/12 |
| 4,733,938 | 3/1988 | Lefevre et al. | 385/12 |
| 4,947,107 | 8/1990 | Doerfler et al. | 324/96 |
| 5,008,611 | 4/1991 | Ulmer, Jr. | 324/96 |
| 5,051,577 | 9/1991 | Lutz et al. | 250/227.17 |
| 5,063,290 | 11/1991 | Kersey | 250/227.17 |
| 5,134,362 | 7/1992 | Ochi | 324/96 |
| 5,136,235 | 8/1992 | Brandle et al. | 324/96 |
| 5,304,920 | 4/1994 | Stierlin | 324/95 |
| 5,361,313 | 11/1994 | O'Keefe | 250/227.17 |
| 5,382,901 | 1/1995 | Okajima et al. | 324/244.1 |
| 5,416,860 | 5/1995 | Lee et al. | 385/12 |
| 5,463,312 | 10/1995 | Lutz et al. | 324/96 |
| 5,510,703 | 4/1996 | Nakamoto | 324/96 |

FOREIGN PATENT DOCUMENTS

| | | | |
|---|---|---|---|
| 452 218 A2 | 10/1991 | European Pat. Off. | H02H 3/28 |
| 650 066 A1 | 4/1995 | European Pat. Off. | G01R 15/24 |
| 0 657 740 A2 | 6/1995 | European Pat. Off. | G01R 15/24 |
| 43 42 409 A1 | 6/1995 | Germany | G01R 19/00 |

OTHER PUBLICATIONS

Japan abstract JP63050761 (Mar. 3, 1988).
Article entitled "Geometrical Separation between the birefringence compoments in Faraday–rotation fiber–optic current sensors" pp. 687–689 May 1, 1991, vol. 16, No. 9, Optics Letters, 1991 Optical Society of America.
Article entitled "Temperature dependence of the Verdet constant in several diamagnetic glasses" by Williams et al., pp. 1176–1178, Apr. 1, 1991, vol. 30, No. 10, Applied Optics.

*Primary Examiner*—Edward P. Westin
*Assistant Examiner*—Kevin Pyo
*Attorney, Agent, or Firm*—Gerald F. Chernivec

[57] ABSTRACT

A Faraday effect current sensor uses a plurality of concatenated field sensors, with a single light source and a single detector. At least two Faraday effect sensing elements (single mode sensing fibers) are used, preferably at least three, the sensing elements being interconnected by fusion spliced, polarizing fibers. The sensing fibers may be oriented generally straight, and arranged to form a regular polygon, e.g., an equilateral triangle for a three-element sensor. The locations of the splices between the sensing fibers and the polarizing fibers may further be advantageously arranged such that the sensing fibers form a substantially closed path which may be placed about the current-carrying conductor. The linearity of the sensor response may be improved by selecting an appropriate value of the bias angle of each sensing element, optimally equal to $\arctan[1/\sqrt{(2n-1)}]$ where n is the number of sensing elements. The present invention may also be adapted for use as a differential current sensor wherein each sensing element is housed in a separate package allowing the elements to be placed about different conductors at a Y-branch, or about a single conductor at different locations.

20 Claims, 2 Drawing Sheets

CONCATENATED MAGNETO-OPTIC FIELD SENSORS

BACKGROUND OF THE INVENTION

1. Field of the Invention

The present invention generally relates to Faraday effect, fiber optic current-sensors, and more particularly to an improved sensor which uses a plurality of field sensors (separate sensing fibers) connected in series.

2. Description of the Prior Art

Optical fibers which are sensitive to magnetic fields are known in the art, and are increasingly being used as optical current transducers (OCT's) for, e.g., electric power utilities. A typical OCT uses a single-mode fiber formed into a coil surrounding the electrical conductor. The polarization of any light traversing the fiber coil shifts, in response to the change in any current flowing through the conductor, as a result of the magneto-optic Faraday effect, also referred to as Faraday rotation or the Kundt effect. The Faraday effect is the manner in which the polarization of a beam of linearly polarized light rotates when it passes through matter in the direction of an applied magnetic field, and is the result of Faraday birefringence. Faraday birefringence is the difference in the indices of refraction of left and right circularly polarized light passing through matter parallel to an applied magnetic field. Further discussion of field-sensitive optical fibers is provided in U.S. Pat. No. 5,051,577 assigned to Minnesota Mining and Manufacturing Co. (3M—assignee of the present invention).

Many prior art references recognize that the response of OCT's may vary considerably due to temperature variations, unacceptably so for highly precise OCT's which may be used in environments having widely varying temperature ranges, such as −40° to +80° C. The prior art recognizes that temperature effects on a sensing coil relate to three different phenomena: (i) changes in the birefringence in the sensing fiber, (ii) changes in birefringence due to stresses induced by the materials encapsulating the sensing fiber, and (iii) changes in the Verdet constant of the fiber core material. Many techniques have been devised to minimize the influence of temperature changes. The most basic technique is to compensate the output based on empirical data, i.e., use a thermometer to determine the temperature during actual measurements, and allow post-processing electronics to adjust the output accordingly. A more complicated variation of this technique is disclosed in U.S. Pat. No. 5,416,860. That system requires not only additional electronic processing, but also requires additional opto-electronic components, which generally increase the cost of the unit. Another complicated method, involving the use of a beam splitter and processing of the two polarization components, is described in U.S. Pat. No. 5,382,901. See also European Patent Application No. 657,740. A different approach is to minimize the temperature dependence by minimizing birefringence of the sensing fiber during its manufacture, such as by spinning the fiber, and then annealing it in a coil form, as taught by U.S. Pat. No. 5,463,312. Special materials for the sensing fiber may also be used to minimize fluctuations due to the changing Verdet constant, as disclosed in "Temperature Dependence of the Verdet Constant in Several Diamagnetic Glasses", Journal of Applied Optics, Vol. 30, No. 10, pp. 1176–1178 (Apr. 1, 1991).

Temperature sensitivity may also be caused by bend-induced birefringence. This may occur, for example, where a single sensing fiber is arranged in two or more straight sections to be placed about the current-carrying conductor, with loops of the fiber formed at the ends of the straight sections. The sensing head described in "Geometrical Separation Between the Birefringence Components in Faraday-Rotation Fiber-Optic Current Sensors," Optics Letters, Vol. 16, No. 9, pp. 687–689 (May 1, 1991), minimizes this effect by selecting appropriate geometric parameters of the loops (radius and number of turns) so that the bend-induced birefringence is a multiple of 27 $\pi$. In the depicted sensing head, the single sensing fiber has been formed into four straight sections generally forming a square about the conductor. While this construction does reduce bend-induced birefringence, it still suffers from a common disadvantage of OCT's, that of installing the sensor on an "endless" cable, i.e., an existing cable that cannot be threaded through the sensor. Sensor coils, as well as square-shaped sensors, may be constructed to allow placement on an endless cable by providing a sufficient spacing between the coil loops or the sides of the square sensing fiber, but this increases the size of the sensor and can affect its accuracy. It would, therefore, be desirable to devise a fiber-optic current sensor having improved temperature-dependence, but which can more easily be installed on an existing cable. It would be further advantageous if the sensor could be fabricated without special materials, special optical components, or specially processed fibers.

SUMMARY OF THE INVENTION

The present invention provides a Faraday effect current sensor generally comprising a light source, at least two Faraday effect sensing elements each having an input and an output, means for coupling the light source to the input of a first one of the sensing elements, means for coupling the output of the first sensing element to the input of the second sensing element, an optical detector, and means for coupling the output of the second sensing element to the optical detector. In the preferred embodiment, the first and second sensing elements are separate sections of single mode sensing fibers, individually maintained in a generally straight orientation, and the various coupling means comprise polarizing fibers which are fusion spliced to the ends of the sensing fibers. The device may include more than two sensing elements, with additional polarizing fibers connecting the elements in series.

Where the sensing elements are generally straight fiber sections, they may be arranged to form a regular polygon, e.g., an equilateral triangle for a three-element sensor. The sensing fiber sections may be mounted to a rigid substrate and held under tension. Using straight sensing fibers removes the need to anneal the fibers during production, which might otherwise be necessary to reduce birefringence effects. The locations of the splices between the sensing fibers and the polarizing fibers may further be advantageously arranged such that the sensing fibers form a substantially closed path which may be placed about the current-carrying conductor.

The linearity of the sensor response may be improved by selecting an appropriate value of the bias angle of each sensing element. This value, defined by the relative angle between slow axes of two polarizing fibers connected to a given sensing fiber, is optimally equal to arctan[1/√(2n−1)] where n is the number of sensing elements. The present invention may also be adapted for use as a differential current sensor wherein each sensing element is housed in a separate package allowing the elements to be placed about different conductors at a Y-branch or on the same conductor at different locations.

BRIEF DESCRIPTION OF THE DRAWINGS

The invention will best be understood by reference to the accompanying drawings, wherein.

DESCRIPTION OF THE PREFERRED EMBODIMENT

Figure 1:
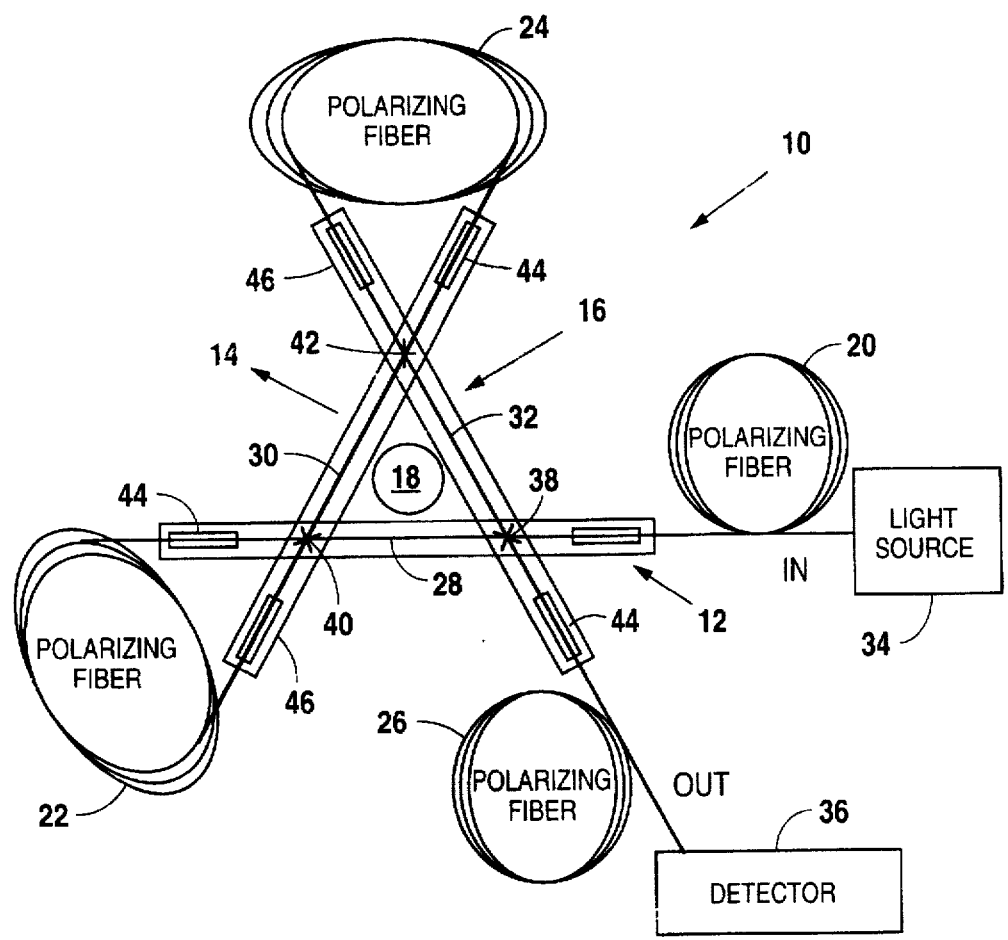
FIG. 1 is a top plan view of the current sensor of the present invention using concatenated field sensors.

With reference now to the figures, and in particular with reference to FIG. 1, there is depicted the one embodiment of a fiber-optic current sensor 10 of the present invention. Current sensor 10 is generally comprised of three concatenated field sensors 12, 14 and 16, positioned adjacent a current-carrying conductor 18, and several adjoining fibers 20, 22, 24 and 26. Each field sensor is essentially a separate piece of Faraday-sensing fiber, thus first field sensor 12 includes a first sensing fiber 28, second field sensor 14 includes a second sensing fiber 30, and third field sensor 16 includes a third sensing fiber 32. Fiber 20 is the input fiber which carries the conditioned light signal from light source 34 (e.g., a light-emitting diode, laser diode, or superluminescent diode) to first sensing fiber 28. Fiber 22 interconnects first sensing fiber 28 with second sensing fiber 30, while fiber 24 interconnects second sensing fiber 30 with third sensing fiber 32. Fiber 26 is the output fiber which carries the field-modified light signal to detector 36 (e.g., a photodiode).

The term "concatenated" refers to the manner in which the field sensors are connected in series. In this regard, the current sensor of the present invention contemplates such serial connection of any number of field sensors. That is, there must be at least 2 field sensors and there must also be at least one optical transmission medium interconnecting the field sensors, where the interconnecting medium is not sensitive to the Faraday effect, or else the two field sensors can be connected directly together. There are preferably at least three field sensors, arranged in the depicted (equilateral) triangular shape. If more than three sensors are used, they are also preferably arranged in the shape of a regular polygon. All of the fibers are preferably attached by means of fusing splicing, although other means may suffice (such as mechanical splicing). The splice points are further preferably located so as to form a closed path or loop about conductor 18, to more accurately gauge the surrounding magnetic field. In other words, the location 38 of the splice between input fiber 20 and first sensing fiber 28 is adjacent, or overlapping, the splice between output fiber 26 and third sensing fiber 32. Similarly, the location 40 of the splice between first sensing fiber 28 and connecting fiber 22 overlaps the splice between connecting fiber 22 and second sensing fiber 30, and the location 42 of the splice between second sensing fiber 30 and connecting fiber 24 overlaps the splice between connecting fiber 24 and third sensing fiber 32. The splice points would also preferably overlap in variations with more than three field sensors. In this manner, the concatenated field sensors approximate a perfect current sensor, with any error in measurement being small enough to ignore for many applications.

The fibers may be supported by any suitable means. In the preferred embodiment, the input and output fibers 20 and 26, as well as connecting fibers 22 and 24, are secured by adhering them to mounting blocks 44 using an adhesive. Blocks 44 in turn rest on quartz bars 46, and may also be secured thereon by gluing.

In the embodiment depicted in FIG. 1, each of the sensing fibers (field sensors) is a generally straight fiber section, i.e., there might be slight deviations from a perfect line but the fibers are not intended to be curved at all. This avoids the adverse effects of bend-induced birefringence, and also obviates the need for annealing the sensing fibers. Straight sections can also be more easily held stiff (by placing them under tension) which further makes them less sensitive to changes in temperature. Nevertheless, the sensing fibers could alternatively be curved to more closely approximate a circle about the conductor but, if so, they are preferably annealed to reduce birefringence effects.

By providing separate sections of sensing fibers, coupled to each other, installation is simplified. This construction imparts flexibility to current sensor 10 since its components may move relative to one another during installation, e.g., allowing the sensor to be placed about an existing (endless) cable without cutting the cable. The provision of multiple field sensors may also decrease temperature dependence since the apparent angle of rotation (the main cause of temperature sensitivity in these types of sensors) should follow the rms. average of all of the sensing elements, making the sensor inherently more stable to temperature as the number of field sensors increases.

Figure 2:
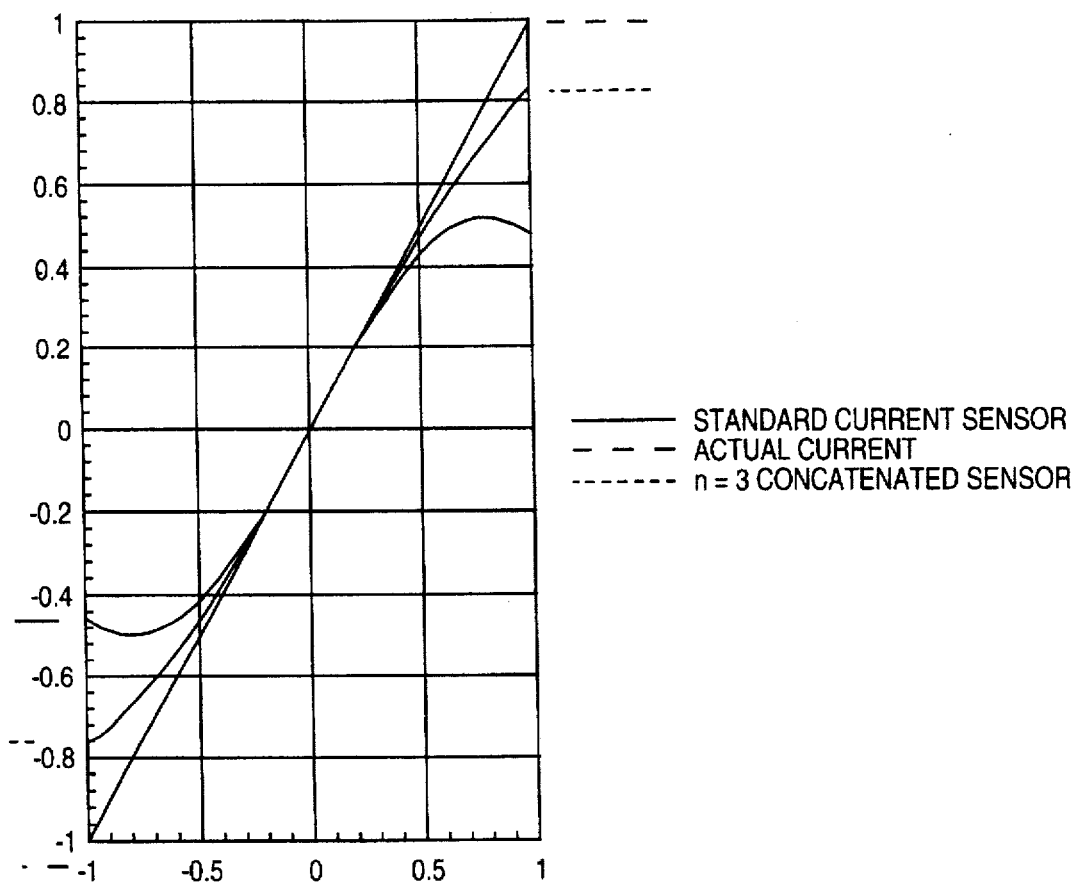
FIG. 2 is a graph depicting the response of the current sensor of the present invention, compared to conventional current sensors.

By designing the sensor so that the magneto-optic rotation is the same in all of the sensing elements and the bias angle is equal to $\arctan[1/\sqrt{(2n-1)}]$, where n is the number of sensing elements, the response of the sensor to current is more linear than conventional magneto-optic current sensors ("bias angle" refers to the polarization angle between the fibers at either end of a sensing fiber, i.e., the relative angle between the slow axes of the polarizing fibers; "magneto-optic rotation" refers to the polarization angle change induced by the target current). This value of the angle is derived by maximizing the linearity of the modulation transfer function. Thus, for the case of n=3 (FIG. 1), the optimum angle between polarizers is $\arctan(1/\sqrt{5})=24.1°$. The sensitivity of the sensor in this case is $1/\sqrt{(2n-1)}$ and the sensor loss approaches $1/\sqrt{e}$ as n becomes large; here, sensitivity is relative to a standard, single-loop fiber optic current sensor. As shown in FIG. 2, the response of the sensor is more linear than with a single-loop fiber optic current sensor, over an extended range of current; line A represents the actual current, line B represents the response from a conventional sensor, and line C represents the response of current sensor 10, where n=3. Testing has also shown that the temperature response of the sensor of FIG. 1 is essentially limited only by the temperature dependence of the Verdet constant of the fiber material, i.e., nearly perfect theoretical performance; this is the first instance of such performance in a single-detector, non-annealed current sensor. Verdet temperature dependence may further be compensated by attaching the fibers at predetermined, favored bias angles as taught in U.S. patent application Ser. No. 08/539,059.

The sensor response may vary if the conductor is not located at the center of the sensor (i.e., for FIG. 1, the center of the equilateral triangle formed by the sensing fibers), but any deviation in the linearity of the response is negligible provided that the deviation of the conductor location from center is no more than 10% of the circle inscribed by the polygon, so centering of the conductor should not be a critical task. The effects of external magnetic fields on the sensor should similarly be negligible providing that the source of the fields is far from the sensor relative to the sensor size.

The preferred types of fibers used with the present invention are available from 3M Specialty Optical Fibers in West Haven, Conn. Each of the fibers 20, 22, 24 and 26 are preferably polarizing (PZ) fibers available under part number FS-PZ-4611/200SA (operating wavelength 850 nm). The sensing fibers 28, 30 and 32 are preferably spun, single mode fibers available under part number FS-SM-4611 (operating wavelength 780 nm). Blocks 44 are preferably quartz plates formed from microscope slides and cut into 1/8"×1/2"×1 mm pieces. Alumino-silicate substrate 46 was procured from AC Technologies of Yonkers, N.Y., under part number ACMA-1100. A suitable glue used to adhere the fibers is the UV cured epoxy NOA #72 from Norland Products of New Brunswick, N.J. A suitable glue for adhering blocks 44 to bar 46 is available from Electronic Materials of Danbury, Conn., under part number XP 1060-930-45-1A. A laser diode optical package for light source 22 was obtained from Point Source Ltd. of Winchester, England, under part number LDS-Pz-3-K-780-0.5-TE. The alternative super-luminescent diode contained in a Point Source Ltd. package was manufactured by EG&G Optoelectronics of Vaudreuil, Canada. The preferred detector 34 is the Si photo-detector model number 260 from Graseby Optronics of Orlando, Fla.

Other types of magneto-optic sensing mediums may be used in place of single mode fibers, such as bulk glass, YIG (yttrium-iron-garnet crystal), etc. Other types of polarizers may also be used, including bulk optic polarizers such as LAMIPOL (available from Sumitomo Electric of Japan) or POLARCOR (available from Corning Glass, of Corning, N.Y.).

Figure 3:
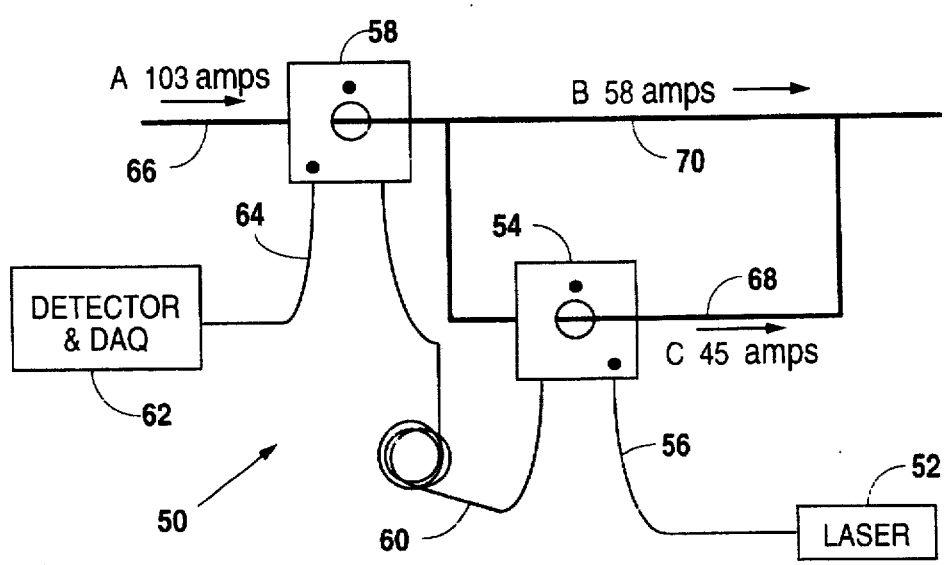
FIG. 3 is a schematic drawing of the differential current sensor according to the present invention.

The concept of concatenated field sensors may also be applied to a differential current sensor, as shown in FIG. 3. Differential current sensor is generally comprised of a light source 52, a first field sensor 54, an input fiber 56 which carries the conditioned light signal from light source 52 to first field sensor 54, a second field sensor 58, a connecting fiber 60 which interconnects first field sensor 54 with second field sensor 58, a detector 62 and an output fiber 64 which carries the field-modified light signal to detector 62. Detector 62 is typically connected to or integrated with signal processing electronics. Differential current sensor 50 measures current by placing the two field sensors along different locations of a conductor Y-branch having an input line 66 and two output lines 68 and 70. In the positions shown in FIG. 3, first field sensor 54 is placed about a portion of first output line 68, and second field sensor 58 is placed about a portion of input line 66. The serial connection between field sensors 54 and 58 results in an output which is proportional to the difference between the two currents flowing between the two sensors.

The differential current sensor of the present invention can also be placed on a single conductor, at different locations, to monitor continuity of current. Also, for long distances between sensors, it would be preferable to use standard single-mode fiber to connect the two. In this case the sensor would require a depolarizer somewhere between the two sensing fibers. The sensors must be calibrated and have their sensitivities well-characterized to allow proper differential measurement. Most applications for this architecture would probably be looking for relatively large differences in the currents (e.g., a short located somewhere between the two sensors on the same line).

Figure 4:
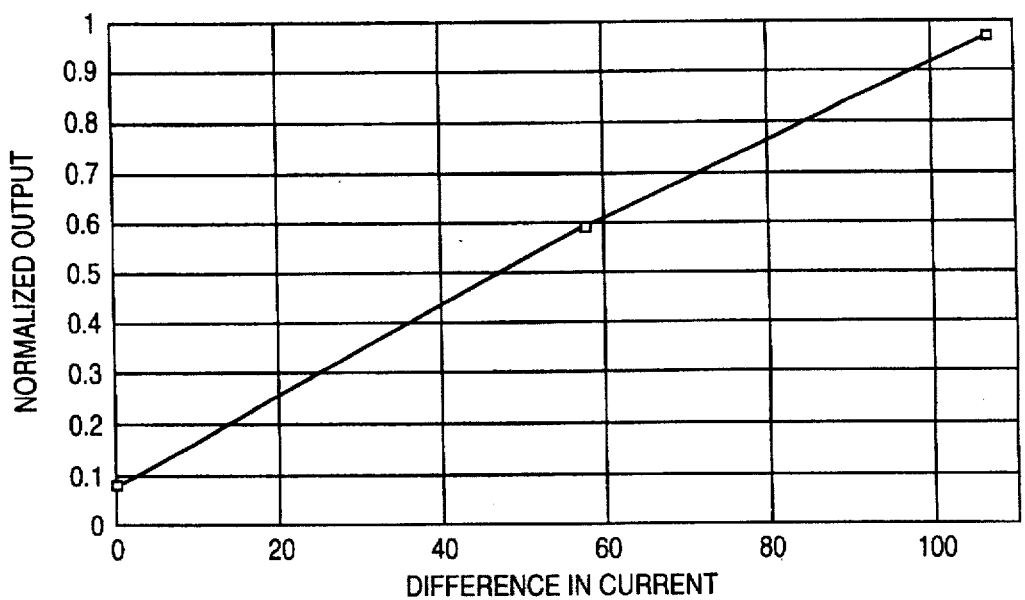
FIG. 4 is a graph depicting the response of the differential current sensor of FIG. 3.

Field sensors 54 and 58 may be conventional sensing coils, or sensors like sensor 10 which actually include multiple sensing fibers concatenated in a single package. The remaining components are similar to those described above. Unlike prior art differential sensors, differential current sensor 50 uses only a single light source and a single detector. This configuration simplifies use, increases reliability and decreases cost, compared to prior art differential sensors, and alleviates concerns regarding perturbations to the connecting fibers that could potentially alter the polarization state of the propagating light wave. FIG. 4 illustrates how differential current sensor 50 operates. The interaction of the first portion of the conductor with the first sensing element causes a modification of the light wave exiting the first sensing element. The second sensing element, located on the second portion of the conductor, will modify this light wave a second time. If the interactions are identical in magnitude but opposite in sign (identical current flow through both sensors) the end result will be zero modification of the light wave. If the currents in the two portions of the conductor differ, the net modification of the lightwave will be non-zero. This is manifested as a non-zero output signal.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

We claim:

1. A device for sensing electrical current flowing through a conductor, the device comprising:

a light source;

a first Faraday effect sensing element having an input and an output;

first means for coupling said light source to said input of said first sensing element;

a second Faraday effect sensing element having an input and an output;

second means for coupling said output of said first sensing element to said input of said second sensing element, said second means comprising a polarizing fiber having first and second ends;

an optical detector; and third means for coupling said output of said second sensing element to said optical detector.

2. The device of claim 1 wherein:

said first sensing element includes a first sensing fiber having first and second ends, said first end thereof being coupled to said light source;

said first end of said second coupling means being spliced to said second end of said first sensing fiber; and said second sensing element includes a second sensing fiber having first and second ends, said first end of said second sensing fiber being spliced to said second end of said polarizing fiber, and said second end of said second sensing fiber being coupled to said detector.

3. A device for sensing electrical current flowing through a conductor, the device comprising:

a light source;

a first Faraday effect sensing element having an input and an output;

first means for coupling said light source to said input of said first sensing element;

a second Faraday effect sensing element having an input and an output;

second means for coupling said output of said first sensing element to said input of said second sensing element;

an optical detector;

third means for coupling said output of said second sensing element to said optical detector; and one or more additional Faraday effect sensing elements; and means for coupling said additional sensing elements in series between said first and second sensing elements include generally straight fiber sections arranged to form a regular polygon.

4. A device for sensing electrical current flowing through a conductor, the device comprising:

a light source;

a first Faraday effect sensing element having an input and an output;

first means for coupling said light source to said input of said first sensing element;

a second Faraday effect sensing element having an input and an output;

second means for coupling said output of said first sensing element to said input of said second sensing element;

an optical detector; and third means for coupling said output of said second sensing element to said optical detector;

wherein said first sensing element is secured to a first package adapted to surround a first portion of a conductor, and said second sensing element is secured to a second package adapted to surround a second portion of the conductor, such that the device may be used as a differential current sensor.

5. A device for sensing electrical current flowing through a conductor, the device comprising:

a light source;

a first Faraday effect sensing element having an input and an output;

first means for coupling said light source to said input of said first sensing element;

a second Faraday effect sensing element having an input and an output;

second means for coupling said output of said first sensing element to said input of said second sensing element;

an optical detector;

third means for coupling said output of said second sensing element to said optical detector; and at least one additional Faraday effect sensing element, for a total of n number of sensing elements, and additional means for coupling said additional sensing elements in series between said first and second sensing elements, wherein:

each of said first, second an additional sensing elements include a sensing fiber;

each of said first, second, third and additional coupling means includes a polarizing fiber; and a given one of said sensing fibers has a bias angle defined by the relative angle between slow axes of adjacent polarizing fibers, said bias angle being approximately equal to $\arctan[1/\sqrt{(2n-1)}]$.

6. A device for sensing electrical current flowing through a conductor, the device comprising:

a light source;

a first Faraday effect sensing element having an input and an output;

first means for coupling said light source to said input of said first sensing element;

a second Faraday effect sensing element having an input and an output;

second means for coupling said output of said first sensing element to said input of said second sensing element;

an optical detector;

third means for coupling said output of said second sensing element to said optical detector; and one or more additional Faraday effect sensing elements, and additional means for coupling said additional sensing elements in series between said first and second sensing elements, wherein:

each of said first, second, third and additional coupling means includes a polarizing fiber;

each of said first, second and additional sensing elements include a sensing fiber attached to at least one of said polarizing fibers at different splice locations; and said splice locations are arranged such that said sensing fibers from a substantially closed path which may be placed about the conductor.

7. The device of claim 2 wherein said first and second sensing fibers are both generally straight fiber sections.

8. The device of claim 2 wherein said first and second sensing fibers are both non-annealed.

9. The device of claim 2 wherein said sensing fibers are spliced to said polarizing fiber by means of fusion splicing.

10. A device for sending electrical current flowing through a conductor, the device comprising:

a light source;

a first Faraday effect sensing element having an input and an output;

first means for coupling said light source to said input of said first sensing element;

a second Faraday effect sensing element having an input and an output;

second means for coupling said output of said first sensing element to said input of said second sensing element;

an optical detector;

third means for coupling said output of said second sensing element to said optical detector;

one or more additional Faraday effect sensing elements; and means for coupling said additional sensing elements in series between said first and second sensing elements, wherein each of said first, second and additional sensing elements include generally straight fiber sections arranged to form a regular polygon;

wherein each of said first, second, third and additional coupling means includes a polarizing fiber;

each of said fiber sections is attached to at least one of said polarizing fibers at different splice locations; and said splice locations are arranged such that said fiber sections form a substantially closed path which may be placed about the conductor.

11. A device for sending electrical current flowing through a conductor, the device comprising:

a light source;

a first Faraday effect sensing element having an input and an output;

first means for coupling said light source to said input of said first sensing element;

a second Faraday effect sensing element having an input and an output;

second means for coupling said output of said first sensing element to said input of said second sensing element;

an optical detector;

third means for coupling said output of said second sensing element to said optical detector;

one or more additional Faraday effect sensing elements; and means for coupling said additional sensing elements in series between said first and second sensing elements, wherein each of said first, second and additional sensing elements include generally straight fiber sections arranged to form a regular polygon;

wherein there are three and only three fiber sections; and said three fiber sections are arranged to form an equilateral triangle.

12. A device for sending electrical current flowing through a conductor, the device comprising:

a light source;

a first Faraday effect sensing element having an input and an output;

first means for coupling said light source to said input of said first sensing element;

a second Faraday effect sensing element having an input and an output;

second means for coupling said output of said first sensing element to said input of said second sensing element;

an optical detector;

third means for coupling said output of said second sensing element to said optical detector;

one or more additional Faraday effect sensing elements; and means for coupling said additional sensing elements in series between said first and second sensing elements, wherein each of said first, second and additional sensing elements include generally straight fiber sections arranged to form a regular polygon;

wherein each of said first, second, third and additional coupling means includes a polarizing fiber;

each of said fiber sections is attached to at least one of said polarizing fibers at different splice locations; and said splice locations are arranged such that said fiber sections form a substantially closed path which may be placed about the conductor;

wherein there are n number of Faraday effect sensing elements each having one of said fiber sections; and a given one of said fiber sections has a bias angle defined by the relative angle between slow axes of adjacent polarizing fibers, said bias angle being approximately equal to $\arctan[1/\sqrt{(2n-1)}]$.

13. An article for Faraday effect sensing of changing magnetic fields, comprising:

at least three Faraday effect field sensors, each having a generally straight section of sensing fiber, said sensing fiber sections being arranged to form a regular polygon; and means for connecting said field sensors in series, said connecting means including a plurality of polarizing fibers, respectively interposed between said sensing fiber sections.

14. The article of claim 13 further comprising:

a light source;

first means for coupling said light source to a first one of said sensing fiber sections;

an optical detector; and second means for coupling a last one of said sensing fiber sections to said optical detector.

15. The article of claim 13 wherein:

there are a total of n number of field sensors; and a given one of said sensing fiber sections has a bias angle defined by the relative angle between slow axes of adjacent polarizing fibers, said bias angle being approximately equal to $\arctan[1/\sqrt{(2n-1)}]$.

16. The article of claim 13 wherein:

each of said sensing fiber sections is attached to at least one of said polarizing fibers at different splice locations; and said splice locations are arranged such that said sensing fiber sections form a substantially closed path which may be placed about a conductor.

17. The article of claim 13 wherein each of said sensing fiber sections is mounted to a rigid substrate and held under tension.

18. A differential current sensor comprising:

a light source;

a first Faraday effect field sensor having an input and an output, said first field sensor being secured to a first package adapted to surround a first conductor;

first means for coupling said light source to said input of said first field sensor;

a second Faraday effect field sensor having an input and an output, said second field sensor being secured to a second package adapted to surround a second conductor;

second means for coupling said output of said first field sensor to said input of said second field sensor;

an optical detector; and third means for coupling said output of said second field sensor to said optical detector, such that a light signal traveling from said light source first passes through said first field sensor and then passes through said second field sensor before reaching said detector.

19. The differential current sensor of claim 18 wherein said first, second and third coupling means comprise first, second and third polarizing fibers, respectively.

20. The differential current sensor of claim 18 wherein said second coupling means comprises a fusion splice directly connecting said output of said first field sensor to said input of said second field sensor.

* * * * *